(12) United States Patent
Carballo et al.

(10) Patent No.: US 7,084,689 B2
(45) Date of Patent: Aug. 1, 2006

(54) METHOD AND APPARATUS FOR GENERATING NON-SKEWED COMPLEMENTARY SIGNALS THROUGH INTERPOLATION

(75) Inventors: Juan-antonio Carballo, San Jose, CA (US); Fadi Hikmat Gebara, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 10/988,455

(22) Filed: Nov. 12, 2004

(65) Prior Publication Data

US 2006/0103445 A1    May 18, 2006

(51) Int. Cl.
*H03K 3/00* (2006.01)

(52) U.S. Cl. .................. 327/295; 327/250; 327/256
(58) Field of Classification Search .............. None
See application file for complete search history.

(56) References Cited

U.S. PATENT DOCUMENTS

| | | | | |
|---|---|---|---|---|
| 4,987,324 | A | 1/1991 | Wong et al. | 326/27 |
| 5,047,659 | A | 9/1991 | Ullrich | 327/259 |
| 5,130,568 | A * | 7/1992 | Miller et al. | 327/202 |
| 5,568,081 | A | 10/1996 | Lui et al. | 327/380 |
| 5,596,296 | A * | 1/1997 | Asazawa | 327/291 |
| 6,384,658 | B1 | 5/2002 | Jex | 327/295 |
| 6,466,074 | B1 | 10/2002 | Vakil et al. | 327/295 |
| 6,677,792 | B1 | 1/2004 | Kwak | 327/158 |
| 6,822,500 | B1 * | 11/2004 | Warnock et al. | 327/295 |

OTHER PUBLICATIONS

A Portable Digital DLL for High-Speed CMOS Interface Circuits, IEEE Journal of Solid-State Circuits, vol. 34, No. 5, May 1999, pp. 632-644, Garlepp et al.
A 50% Duty-Cycle Correction Circuit for PLL Output, 2002 IEEE, pp. IV-21 to IV-24, Torun Ogawa et al.
A 300-MHz CMOS Voltage-Controlled Ring Oscillator, 1990 IEEE, pp. 312-315.

* cited by examiner

*Primary Examiner*—Timothy P. Callahan
*Assistant Examiner*—An T. Luu
(74) *Attorney, Agent, or Firm*—Casimer K. Salys

(57) ABSTRACT

A complementary digital signal generator circuit and method receives a periodic digital signal, such as a square wave, as an input and generates at the output complementary versions of the digital signal delayed by matching increments of delay with minimum skew at GHz frequencies. The digital signal is processed by inverters and interpolators which may be readily matched in size and functional characteristics by close proximity placement on integrated circuits. An inverted and first delayed version of the original digital signal is applied to both inputs of a first interpolator, to generate at the output of the interpolator the complement of the digital signal as delayed by the first delayed and the delay introduced by the interpolator. The inverted and first delayed digital signal is inverted and second delayed by a second matching inverter and applied as one input to a second interpolator. The second input of the second interpolator is the original digital signal. The output of the second interpolator is the digital signal delayed by a corresponding combination of the first delay and the delay introduced by the second interpolator. When the first and second interpolators are matched, in the manner of the first and second inverters, the two interpolator outputs provide the digital signal and its complement with substantially no skew and matching increments of delay.

27 Claims, 5 Drawing Sheets

METHOD AND APPARATUS FOR GENERATING NON-SKEWED COMPLEMENTARY SIGNALS THROUGH INTERPOLATION

CROSS REFERENCE TO RELATED APPLICATIONS

The present application is related to co-pending U.S. patent application Ser. No. 10/988,454, titled Duty Cycle Corrector, the related application having one common inventor with and assigned to the same assignee as the present application. The specification of the above referenced patent application is herein incorporated by reference.

BACKGROUND OF THE INVENTION

1. Technical Field

The present invention relates generally to digital circuits, and more particularly to the generation of synchronized digital signals of complementary state.

2. Description of the Related Art

The pervasiveness of digital systems in computers and communication systems necessitates quality digital signal synchronization whether it be within an integrated circuit processor, on bus systems of a personal computer or server, or in the transmission or receiver systems of wireless devices. The significance of synchronization has increased dramatically as the frequencies of the digital signals have increased into the GHz range. A key aspect of such synchronization is the management of skew within signals, such as a system clock signal, not only in the distribution process but in circuit implementations of the signals. A particular example of the skew problem arises when complementary forms of a digital signal are necessary, namely, the signal and its complement with minimum relative skew there between.

The generation of two complementary signals that are 180 degrees apart in phase from a single phase input signal has been approached through different techniques in the prior art. One common technique employs multiple strings of inverters driving matched capacitors necessitating designs with precise gate level matching of the field of transistors and matching of the capacitive devices to minimize signal skew between the complementary version of the signal. This technique is very susceptible to manufacturing process variations normally associated with the fabrication of integrated circuit devices, which variations are tending to increase as device sizes shrink. Another common technique employs the use of XOR gates, but again requires gate level matching of differing integrated circuit devices and is susceptible to asymmetry with respect to the supply voltage and ground inputs, as well as the aforementioned sensitivity to fabrication process variations. A further technique is described in U.S. Pat. No. 6,466,074, wherein slew control is carefully managed by the sizing and placement of differing integrated circuit devices. Other practices of slew control potentially applicable to skew management and the generation of complimentary signals are described in U.S. Pat. Nos. 4,456,837, 4,987,324 and 5,568,081. Another technique for generating complementary signals is described in U.S. Pat. No. 6,384,658, where again device and layout matching are practiced to split a clock signal in pursuit of generating an inverted clock signal. The use of logic gates to generate complementary output signals of a digital input are described in U.S. Pat. No. 5,047,659, but again the practice of using gate delays necessitates matching of differing devices and thereby becomes susceptible to manufacturing process variations.

The prevalence of using signals and their complements in digital circuits, most often clocking, at the GHz frequencies now commonly encountered, necessitates a structurally simple circuit configuration which takes a digital input signal and generates a complimentary pair of signals with minimum skew, and which is composed of active integrated circuit devices which can be manufactured with relatively matching characteristics with provisions for adjustability if the circumstances of the application so necessitate.

SUMMARY OF THE INVENTION

The generation of complementary digital signals with minimum skew and sensitivity to fabrication process variations is accomplished through the apparatus and methods of the present invention using inverters and inverter derived interpolators.

In one form the invention is practiced through a method whereby a digital input signal is inverted and delayed by a first increment of delay, and applied identically to both inputs of an interpolator to generate at the output of the interpolator the complementary version of the digital input signal. According to the method, the other of the complimentary output signals is generated by using an inverter to process the inverted and delayed digital signal, and to introduce a second corresponding incremental delay and applying such result as one input to another interpolator while having the digital input signal itself serving as the second input to such second interpolator. The first of the interpolators generates an inverse of the digital input signal with a defined multiple incremental delay, and the second of the interpolators regenerates the original digital signal with a corresponding multiple incremental delay.

In an apparatus form of the invention, the digital input signal is provided to an inverter whose output is the digital input signal delayed by an increment and connected to both inputs of a first interpolator. The output of the first interpolator is the complement of the digital signal delayed by the incremental delay of the inverter combined with the delay of the interpolator.

The output of the first inverter, namely the digital input signal inverted and delayed by one increment, is provided to a second matching inverter to generate at the output of the second inverter the digital input signal delayed by two increments. The second interpolator receives as one input the output of the second inverter and receives as its second input the original digital signal. The output of the second interpolator is the non-complementary version of the input digital signal delayed by the increments attributable to the interpolator and one half the delay as generated by the second inverter. The result is a matching incremental delay.

The foregoing and other objectives, features, advantages of the invention will become apparent from the following, more particular, description of preferred embodiments of the invention, as illustrated in the accompanying drawings.

DESCRIPTION OF ILLUSTRATIVE EMBODIMENT

In the following description numerous details are set forth such as specific circuit elements, gates, et cetera to provide a thorough understanding of the present invention. However, it will be obvious to those skilled in art that the present invention may be practiced without such specific details for using alternative hardware or software for accomplishing the same functions. Some details may have been omitted inasmuch as such details are not necessary to obtain a complete understanding of the present invention and are within the skills of persons of ordinary skill in the relevant art.

Figure 1:
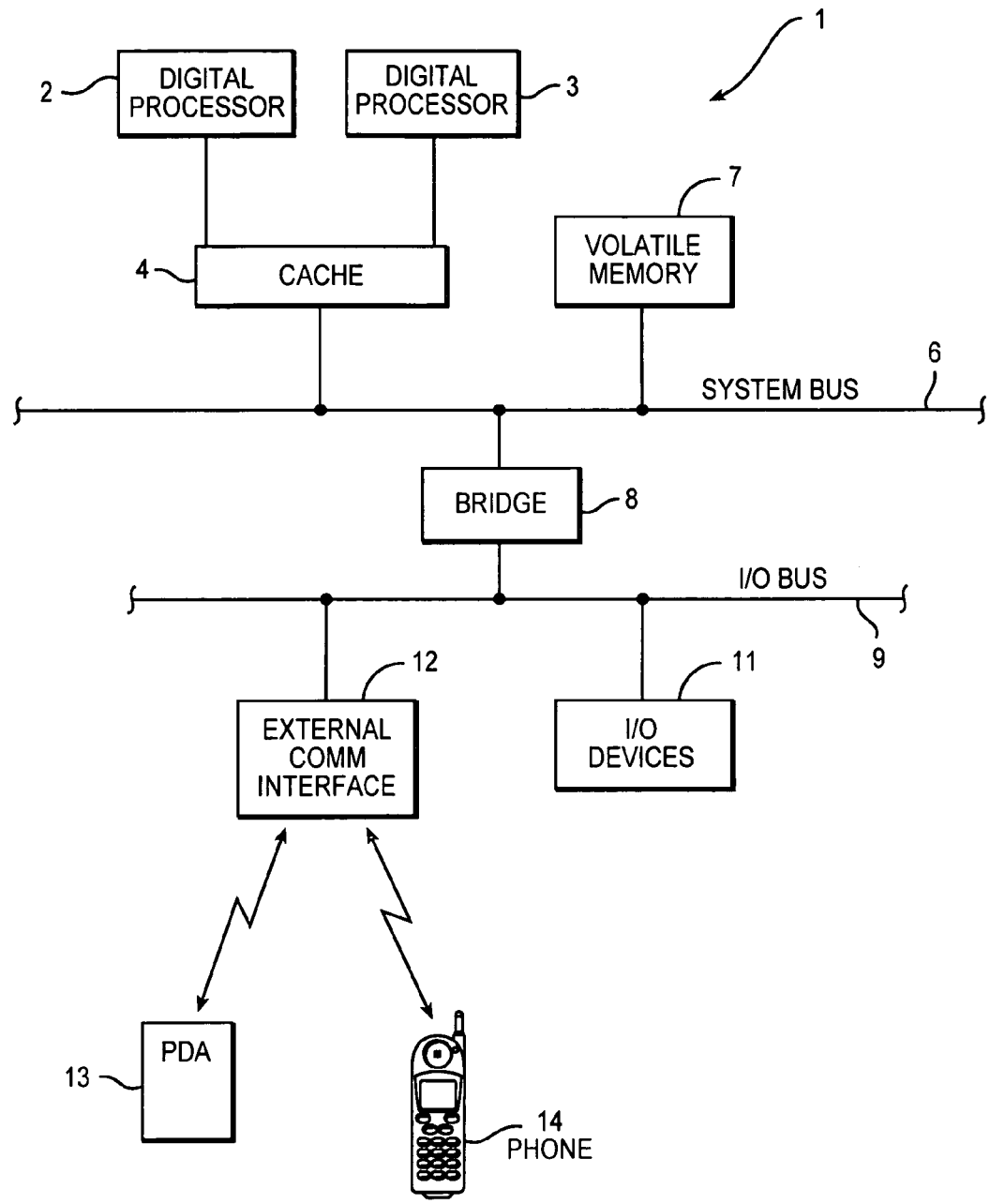
FIG. 1 is a schematic block diagram of digital systems which routinely use signals and complements thereof with minimum skew therebetween to accomplish data processing and wireless communication.

Referring now to the drawings wherein depicted elements are not necessarily shown to scale and wherein like or similar elements may be designated by the same reference numerals through the several views. FIG. 1 illustrates a system level depiction of the context within which the invention may be practiced, in particular, typical functional elements which process digital format signals. As shown in FIG. 1, system 1 illustrates a personal computer or server having a pair of digital processors 2 and 3 coupled through a cache 4 to a system bus 6, which system bus 6 is also coupled to volatile main memory 7. System bus 6 is shown to be connected through bridge 8 to I/O bus 9, which generally has attached thereto various I/O device 11 and external communication interface 12. As depicted, external communication interface 12 provides wireless communication directly or indirectly to personal digital assistant 13 and telephone 14 by commonly known radio frequency techniques. Periodic digital signals are generated, processed and distributed throughout the system as well as within each functional element depicted in FIG. 1, whether they be in the form of data, address, control, or clock synchronization signals. The presence of such digital signals routinely require the generation of complementary pairs of such signals with minimum distortion and skew notwithstanding the GHz frequencies now common of such systems and functional devices.

Figure 2:
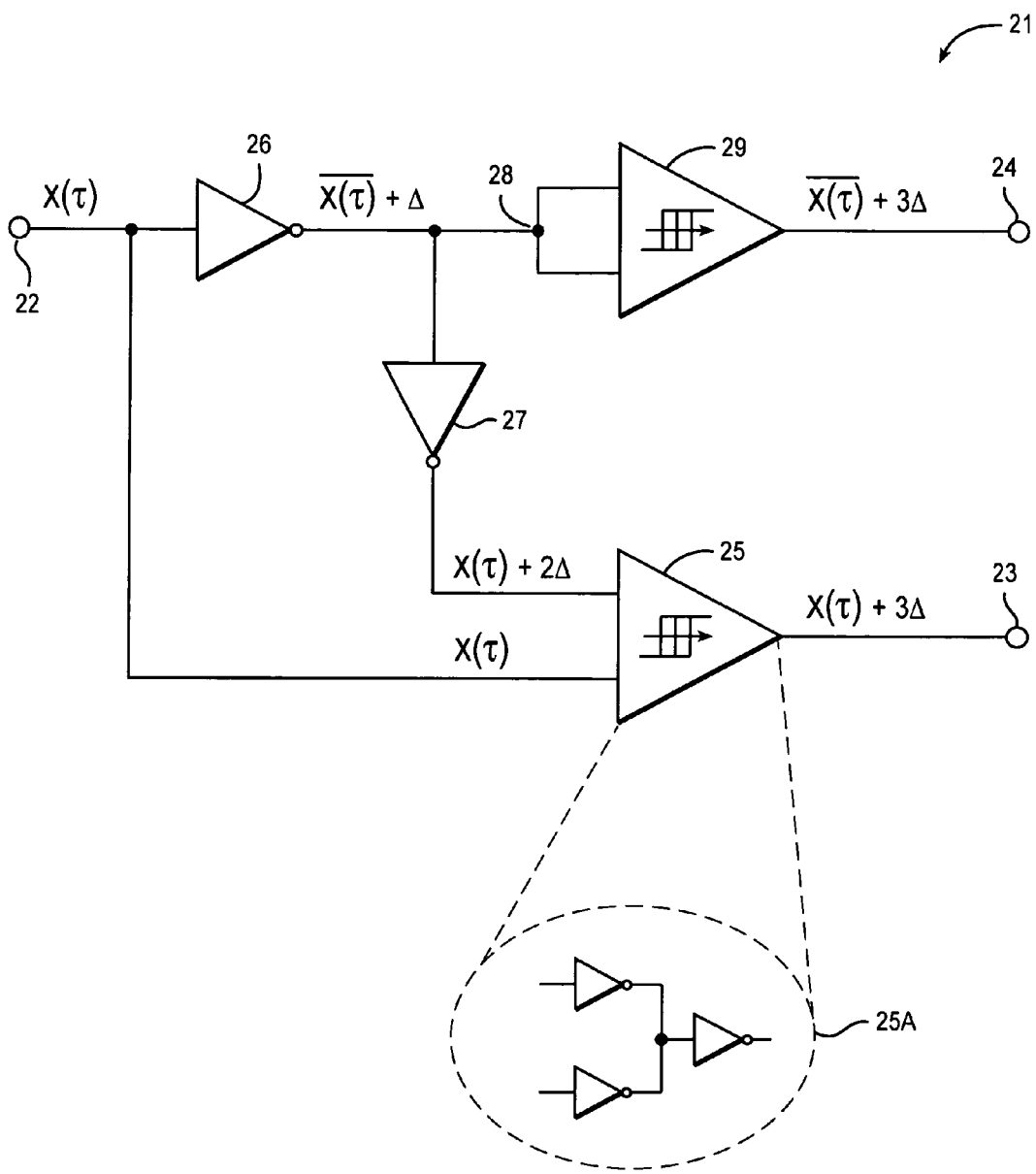
FIG. 2 is a schematic diagram of a circuit for accomplishing complementary generation of digital signals.

According to the methods and apparatus of the present invention, complementary and synchronous versions of digital signals may be generated through the implementation of a circuit as functionally depicted in FIG. 2. As shown, complementary signal generator 21 receives an input at node 22 in the form of a digital format time varying signal X(t) and provides complementary outputs at nodes 23 and 24 with minimum relative skew delayed in time by a time by matching increments of 3 Delta. As embodied in FIG. 2, the circuit includes an inverter 26 which receives at its input the signal X(t) and generates at its output the complement of the signal delayed by a time increment Delta. The output of inverter 26 is then inverted by inverter 27 to provide an output X(t) delayed by 2 Delta. The Delta time increment represents the signal inversion time delay attributed to matching inverters 26 and 27. The output of inverter 26, namely the complement of X(t) as delayed by Delta is provided from common node 28 to both inputs of interpolator 29. Interpolator 25, which is designed and fabricated to match interpolator 29, receives as its two inputs the original digital signal X(t) and the output from inverter 27 in the form of X(t) as delayed by 2 Delta. The output from interpolator 29 is the complement of X(t) as delayed by 3 Delta while the output of interpolator 25 is the digital signal X(t) also as delayed by 3 Delta. As embodied, interpolators 25 and 29 functionally introduce matching delays of 2 Delta by virtue of their implementation involving parallel connected and cascaded stages of inverters which match inverters 26 and 27. Interpolators 25 and 29 may be designed to introduce other amounts of delay and accordingly delay the digital signal by an amount other than 3 Delta while allowing a practice of the present invention, to the extent that such contributions of interpolators 25 and 29 are matched. Note that the outputs of circuit 21 on nodes 23 and 24 are two synchronized but 180 degrees out of phase signals.

Figure 3:
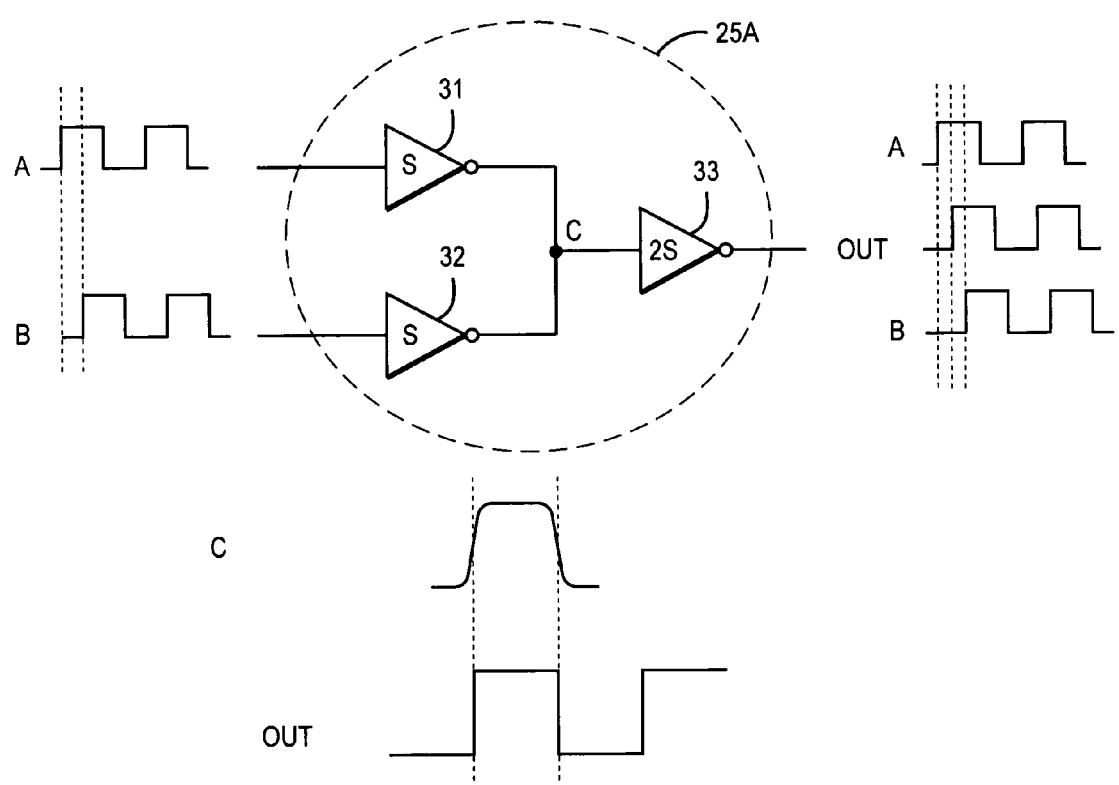
FIG. 3 is a schematic diagram illustrating the functions of an interpolator.

FIG. 3 illustrates through input and output signal waveforms operations of one interpolator 25A configuration as first depicted in FIG. 2. Note that the digital input signals A and B represent a digital signal, A, and a time delayed version of the same digital signal, B. The output at OUT from interpolator 25A is a digital signal which transitions, in the embodiment, from a low level to a high level at the midpoint in time between the rise of the A signal and the rise of the B signal.

The division of the time delay into two equal parts is attributable, as shown with reference to the signal at node C, to the fact that node signal C transitions through the switch point of output inverter 33 during the course of the delay interval. The balanced division of the time delay between digital signals A and B as effectuated by interpolator 25A is attributable to a match in the size of inverters 31 and 32, a corresponding doubling of the size for inverter 33, and a selection of the switching threshold for inverter 33 to be situated at the halfway point between the supply voltage and ground. These refinements are standard design parameters for integrated circuit devices and are readily effectuated when devices 31, 32 and 33 are fabricated in close physical proximity on an integrated circuit chip.

The proximity of fabrication and matching dimensions also apply to inverters 26 and 27 as depicted in FIG. 2, so that any delay attributed to inverters 26 and 27 is matched.

Figure 4:
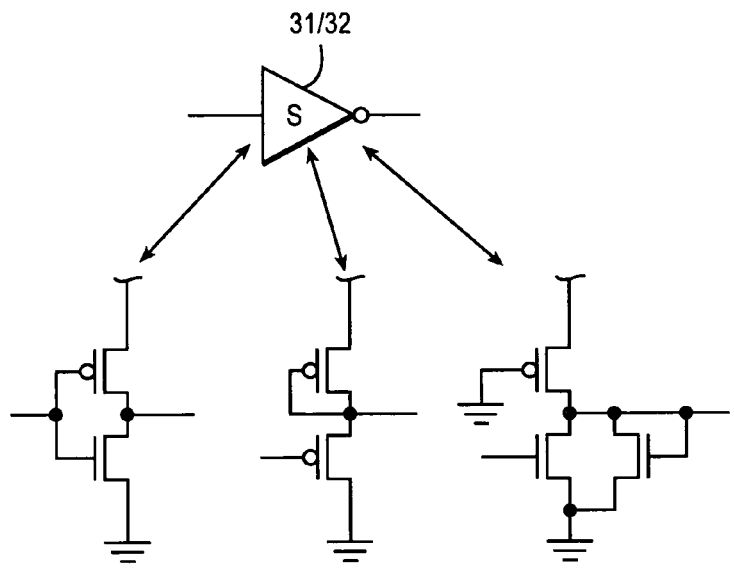
FIG. 4 is a schematic diagram of various forms of interpolator inverter elements.

FIG. 4 illustrates three field effect transistor embodiments for inverters such as 31/32 in FIG. 3. Investigation has indicated that integrated circuit fabrication process sensitivity can be minimized by using low gain configurations of such inverters.

Figure 5:
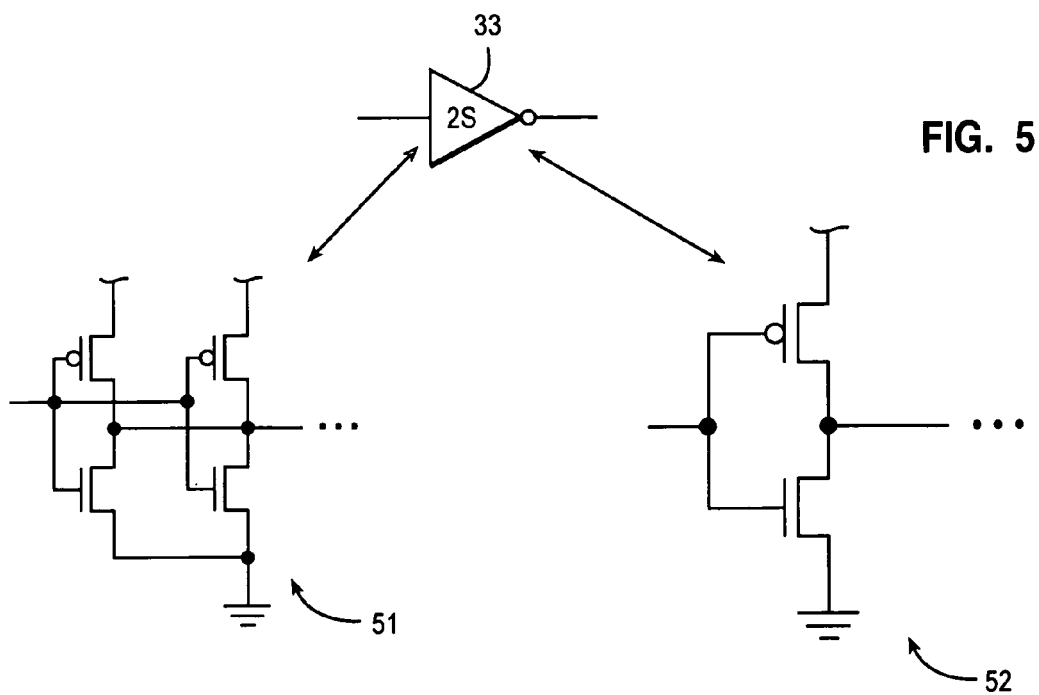
FIG. 5 is a schematic diagram of a sized inverter from an interpolator.

FIG. 5 illustrates embodiments of inverter 33 from FIG. 3, where the key distinction from inverters 31 and 32 as shown in FIG. 4 is that inverter 33 is sized to twice the drive capacity of each single inverter 31 or 32. As shown in FIG. 5, the field effect transistor implementation can involve a parallel connection of inverter stages such as used in inverters 31 or 32, or can utilize structurally larger transistors to provide the size scaling. In addition to the size scaling to match the speed and drive capability of inverter 33 to the combination of parallel connected inverters 31 and 32, an additional objective is to ensure that the switching thresholds of the transistors in inverter 33 are situated at the midpoint between supply voltage and ground. Parallel connections of field effect transistor inverters are shown at 51, while large transistor sized implementations are conceptually depicted at 52.

Figure 6:
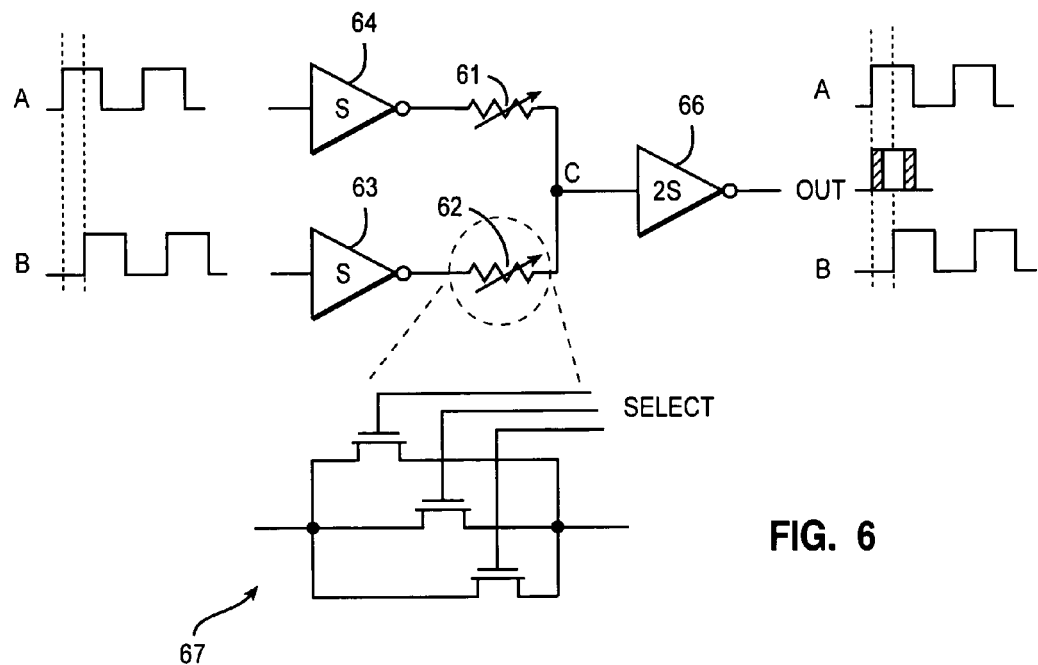
FIG. 6 is a schematic diagram illustrating the use of variable resistor functions to adjust interpolator operation.

FIG. 6 schematically illustrates other embodiments of interpolators such as 25 and 29 in FIG. 2. As depicted in FIG. 6, variable resistors 61 and 62 are introduced in the path between inverters 63 and 64. As the effective values of resistors 61 and 62 are varied the voltage on node C is shifted up or down when inverter 63 and 64 are in opposite output states. In this way the timing of when node C reaches the switching threshold of output inverter 66 may be shifted in magnitude and thereby in time. This ability to shift the switching time and correspondingly the division of the interval between waveforms A and B is depicted in the waveform corresponding to OUT, by shading. Variable resistors 61/62 may be implemented as fusible devices or electronically selectable magnitudes, as represented by parallel connected pass field effect transistors 67 individually responsive to select signals.

Figure 7:
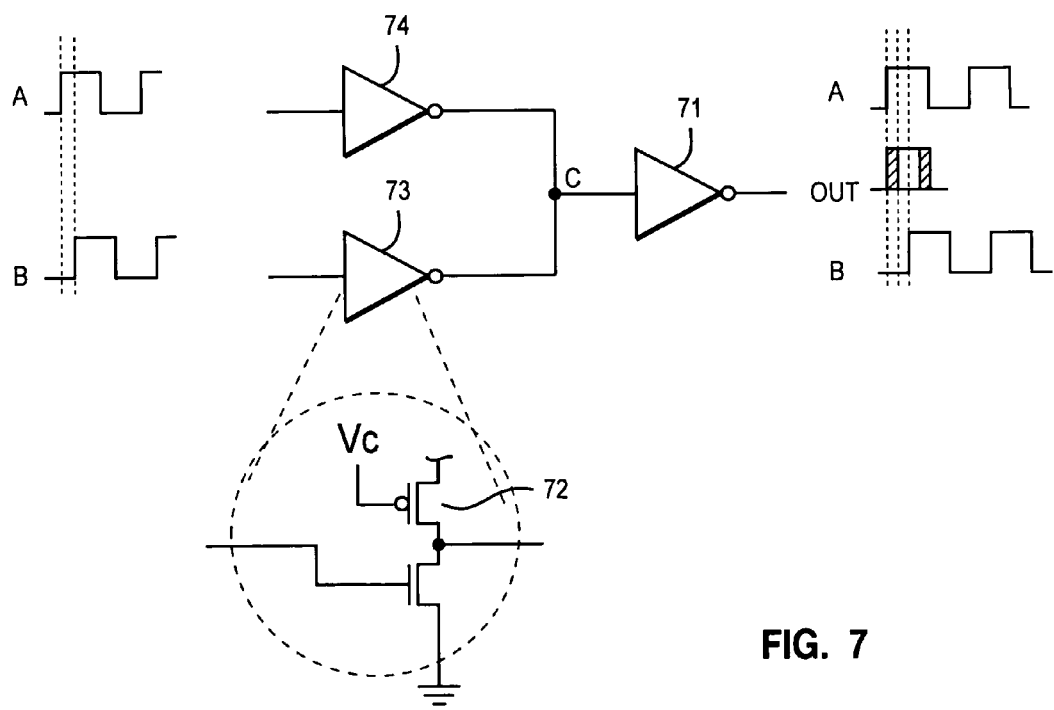
FIG. 7 is a schematic diagram illustrating the use of voltage biasing to adjust interpolator operation.

FIG. 7 illustrates another embodiment by which the interpolator operation may be adjusted by having the time at which node C reaches the switching threshold of inverter 71 variable. As shown, transistor 72 in inverter 73 is biased using control voltage Vc to accelerate or delay the time when output inverter 71 switches. The range of adjustment in the delay is again depicted by shading for the signal OUT. The use of biasing to control switching as illustrated in FIG. 7 is correspondingly applicable to other transistors of those in inverters 71, 73 and 74 of the interpolator.

As noted earlier, the invention is particularly suited to processing of periodic digital signals, such as square wave clock signals, to generate complementary versions of the signals with minimum skew. The limited number of components associated with the embodiment of the present invention, such as appears in FIG. 2, and the ability to fabricate such devices in close proximity on integrated circuits so as to gain the benefit of active device matching, makes the invention particularly valuable and usable at very high frequencies. The fact that functional devices, such as inverters 26 and 27 are from extensive experience in the art readily amenable to matching so as to provide corresponding time delays Delta, and the fact that interpolators such as 25 and 29 can be similarly matched, provides the invention with a high degree of flexibility heretofore unattainable for complementary digital signal generators.

While the invention has been particularly shown and described with reference to the preferred embodiments thereof, it will be understood by those skilled in the art that the foregoing and other changes in form in detail may be made therein without departing from the spirit and scope of the invention.

What is claimed is:

1. A complementary digital signal generator, comprising:
   a digital signal source;
   means for generating an inverse of the digital signal delayed by a first increment, coupled to the digital signal source;
   means for generating the digital signal delayed by a second increment, the second increment nominally being twice that of the first increment, coupled to the means for generating an inverse of the digital signal delayed by the first increment;
   a coupling of the inverse of the digital signal delayed by the first increment to first and second inputs of a first interpolator to generate an inverse of the digital signal delayed by a third increment; and
   a coupling of the digital signal delayed by the second increment and the digital signal to respective first and second inputs of a second interpolator to generate the digital signal delayed by the third increment.

2. The apparatus of claim 1, wherein the digital signal is a square wave.

3. The apparatus of claim 2, wherein the digital signal is a clock signal.

4. The apparatus of claim 1, wherein the means for generating an inverse of the digital signal delayed by the first increment is a first inverter.

5. The apparatus of claim 4, wherein the means for generating the digital signal delayed by the second increment is a second inverter coupled to the first inverter.

6. The apparatus of claim 5, wherein the first and second inverters are integrated circuit devices.

7. The apparatus of claim 6, wherein the integrated circuit devices are functionally matched.

8. The apparatus of claim 7, wherein the integrated circuit devices are in close proximity on the same integrated circuit chip.

9. The apparatus of claim 1, wherein the first and second interpolators are functionally matched.

10. The apparatus of claim 9, wherein the first and second interpolators are integrated circuit devices.

11. The apparatus of claim 9, wherein the first and second interpolators each comprise multiple inverters.

12. The apparatus of claim 11, wherein the multiple inverters are integrated circuit devices.

13. The apparatus of claim 12, wherein the integrated circuit devices are in close proximity on the same integrated circuit chip.

14. The apparatus recited in claim 9, wherein the first and second interpolators each have first and second interpolator input inverters, coupled to received respective first and second inputs and to commonly drive a sized output inverter circuit.

15. The apparatus recited in claim 14, wherein the sized output inverter circuit has nominally twice the drive capacity of the first and second interpolator input inverters.

16. The apparatus of claim 15, wherein the first and second interpolator input inverters and sized output inverter circuit are in close proximity on a common integrated circuit chip.

17. The apparatus of claim 5, wherein the first inverter, the second inverter, the first interpolator input inverter, the second interpolator input inverter, and the sized output inverter circuit are functionally matched.

18. The apparatus of claim 17, wherein the first inverter, the second inverter, the first interpolator input inverter, the second interpolator input inverter, and the sized output inverter circuit are in close proximity on a common integrated circuit chip.

19. A digital processing system, comprising:
   a synchronization signal source coupled to distribute a synchronization signal to multiple functional elements;
   a source for generating a digital signal within a first functional element synchronized to the synchronization signal;
   means for generating an inverse of the digital signal delayed by a first increment, coupled to the digital signal source;
   means for generating the digital signal delayed by a second increment, the second increment nominally being twice that of the first increment, coupled to the means for generating an inverse of the digital signal delayed by the first increment;
   a coupling of the inverse of the digital signal delayed by the first increment to first and second inputs of a first interpolator to generate an inverse of the digital signal delayed by a third increment; and
   a coupling of the digital signal delayed by the second increment and the digital signal to respective first and second inputs of a second interpolator to generate the digital signal delayed by the third increment.

20. The system of claim 19, wherein the digital signal is a square wave.

21. The system of claim 20, wherein the digital signal is a clock signal.

22. The system of claim 19, wherein the means for generating an inverse of the digital signal delayed by the first increment is a first inverter.

23. The system of claim 22, wherein the means for generating the digital signal delayed by the second increment is a second inverter coupled to the first inverter.

24. The system of claim 19, wherein the first and second interpolators are functionally matched.

25. A method for generating complementary digital signals, comprising the steps of:
   generating an inverse of a digital signal delayed by a first increment;
   generating the digital signal delayed by a second increment, the second increment nominally twice that of the first increment;
   coupling the inverse of the digital signal delayed by the first increment to first and second inputs of a first interpolator to generate an inverse of the digital signal delayed by a third increment; and
   coupling the digital signal delayed by the second increment and the digital signal to respective first and second inputs of a second interpolator to generate the digital signal delayed by the third increment.

26. The method of claim 25, wherein the digital signal is of square wave format.

27. The method of claim 26, wherein the digital signal is a clock signal.

* * * * *